United States Patent [19]

Dixon

[11] 4,068,792
[45] Jan. 17, 1978

[54] DEVICE FOR PROTECTING THE EDGE CONNECTORS OF PRINTED CIRCUIT BOARDS DURING WAVE SOLDERING

[75] Inventor: Charles Fulton Dixon, Drexel Hill, Pa.

[73] Assignee: Burroughs Corporation, Detroit, Mich.

[21] Appl. No.: 791,871

[22] Filed: Apr. 28, 1977

[51] Int. Cl.² .............................................. B23K 3/00
[52] U.S. Cl. .................................... 228/57; 118/505; 228/39; 269/254 D
[58] Field of Search ............... 228/39, 57; 269/254 D, 269/254 CS; 118/406, 301, 505

[56] References Cited

U.S. PATENT DOCUMENTS

| 2,598,610 | 5/1952 | Satz et al. | 269/254 CS |
| 3,759,436 | 9/1973 | Foster et al. | 228/57 |

FOREIGN PATENT DOCUMENTS

| 619,007 | 9/1935 | Germany | 269/254 D |
| 894,219 | 10/1953 | Germany | 269/254 D |

*Primary Examiner*—Donald G. Kelly
*Assistant Examiner*—K. J. Ramsey
*Attorney, Agent, or Firm*—Francis A. Varallo; Edmund M. Chung; Kevin R. Peterson

[57] ABSTRACT

A device is described for masking the gold connector tabs located along the edges of printed circuit boards to prevent the connectors from becoming solder coated during wave solder operations. The device is comprised of a pair of angle sections coupled to each other by tensioning means. The sections are easily applied to the circuit board assembly without scratching the gold contacts. Moreover, they provide stiffness to the board and a dam to prevent solder from flowing over the board and damaging the electrical components mounted thereon during wave soldering. The device is easily removable from the circuit boards after soldering and is reusable. Finally, the device of the present invention is characterized by long life, reasonable cost and ease of use.

7 Claims, 3 Drawing Figures

DEVICE FOR PROTECTING THE EDGE CONNECTORS OF PRINTED CIRCUIT BOARDS DURING WAVE SOLDERING

BACKGROUND OF THE INVENTION

The high density packaging of electronic components frequently involves the wave soldering of printed circuit board assemblies. In the wave solder operation the electrical interconnections of the components are accomplished en masse as the underside of the circuit board is transported through the solder bath in a semi-automatic operation. The circuit itself, together with the components mounted thereon, represent a costly investment. Yet problems have existed for some time in the soldering operation which may render the circuit board completely unusable, or at best, usable after considerable rework. The latter is accomplished only at substantial labor cost and delay. These problems include damage to the circuit board edge connectors which are usually gold plated. The damage may be the result of unwanted solder coating or the scratching or abrading of the gold surface by the masking means used to prevent the former occurrence. Other problems involve the warping or sagging of the circuit boards as they are subjected to the high heat of the molten solder, and the overflow of the solder onto the component side of the board.

A number of prior-art devices have been used to prevent or minimize the foregoing problems, but each has been found to be deficient in one or more of the areas of effectiveness, damage to the connectors, cost, life or labor required in its use. For example, clip-on devices of various types have been used. Those comprised of one piece of spring metal tend to scratch the gold contacts as they are slipped on and off the edge of the circuit board, and this condition appears to worsen as they are reused over a period of time. Covering the metal with a smooth high temperature material, such as Teflon, solves the scratching problem, but these devices are expensive and have a limited life. Other clip-on devices involving an assembly of hinged parts have been found to be less effective and to require high maintenance due to the entry of solder into the moving parts. Slotted rubber extrusions adapted to slip over the edge of the board have been employed but these are relatively fragile and provide no stiffness to prevent board sagging during the solder operation. Cast rubber and metal devices are reasonably effective but are fragile and difficult to manufacture. A well known method of masking the contacts involves the use of high temperature tape with an adhesive backing which is placed over the contacts. This technique requires considerable time and labor to apply the tape carefully and to remove it after soldering. Moreover, it does not provide the required board stiffness and a dam to prevent solder overflow onto the components.

What is required of the protective device is that it be easily applied to the circuit board assembly, stay in place and be readily removable without at any time scratching the surface of the edge contacts. It must resist solder temperatures and be rugged in construction since it is subjected to handling by heavily gloved hands. It must have reasonable life, cost and labor requirements. Finally, it must provide board stiffness and a dam to prevent solder from flowing over the top of the board. The device of the present invention meets all of the foregoing requirements.

SUMMARY OF THE INVENTION

In accordance with the present invention, there is provided a pair of angle sections which tend to be drawn toward each other by spring tensioning means coupled thereto. The sections have openings therein to receive the respective leading and trailing edges of the circuit board assembly as it advances across the solder wave. The sections extend across the full width of the board and the spring extends the length of the board above the components on the upper surface thereof. Apart from the aforementioned openings, the sections have a substantially right triangular cross-sectional geometry.

In the wave soldering operation, the printed circuit board is supported in a horizontal position by the soldering equipment. The sides of the right angle portion of the device section define a vertical member which serves as a dam to prevent solder overflow onto the board and a horizontal member which serves as a ledge to support the board.

The opening in each section results from terminating the horizontal member before it reaches the extremity of the hypotenuse of the triangular section. By rotating each section in turn about its horizontal axis through the vertex of the right angle, the respective edges of the circuit board may be inserted into the openings until their extremities contact the side members of the section. It should be noted that no rubbing of the edge contacts takes place during this operation. At this point, release of the last applied section will permit the spring tension to return both sections to their normal positions. The extremities of the board now contact the vertex of the section right angle and the contact area of the board rests upon the inner surface of the horizontal ledge member. The length of the hypotenuse is a function of the circuit board thickness. It is chosen such that the spring tension will cause the free end of the hypotenuse to exert a line force across the board width which in turn results in the edge surface of the board being held firmly in contiguity with the inner surface of the horizontal ledge member.

Upon completion of the solder operation, a first of the protective sections is again rotated in opposition to the spring tension and the board is slipped out of the opening, again without any rubbing contact with the device. The opposite end of the board is then easily removed from the remaining section by a slight rotation thereof.

These and other features of the invention and its mode of operation will become more fully apparent in the detailed description of the device which follows:

DESCRIPTION OF THE PREFERRED EMBODIMENT

Figure 1:
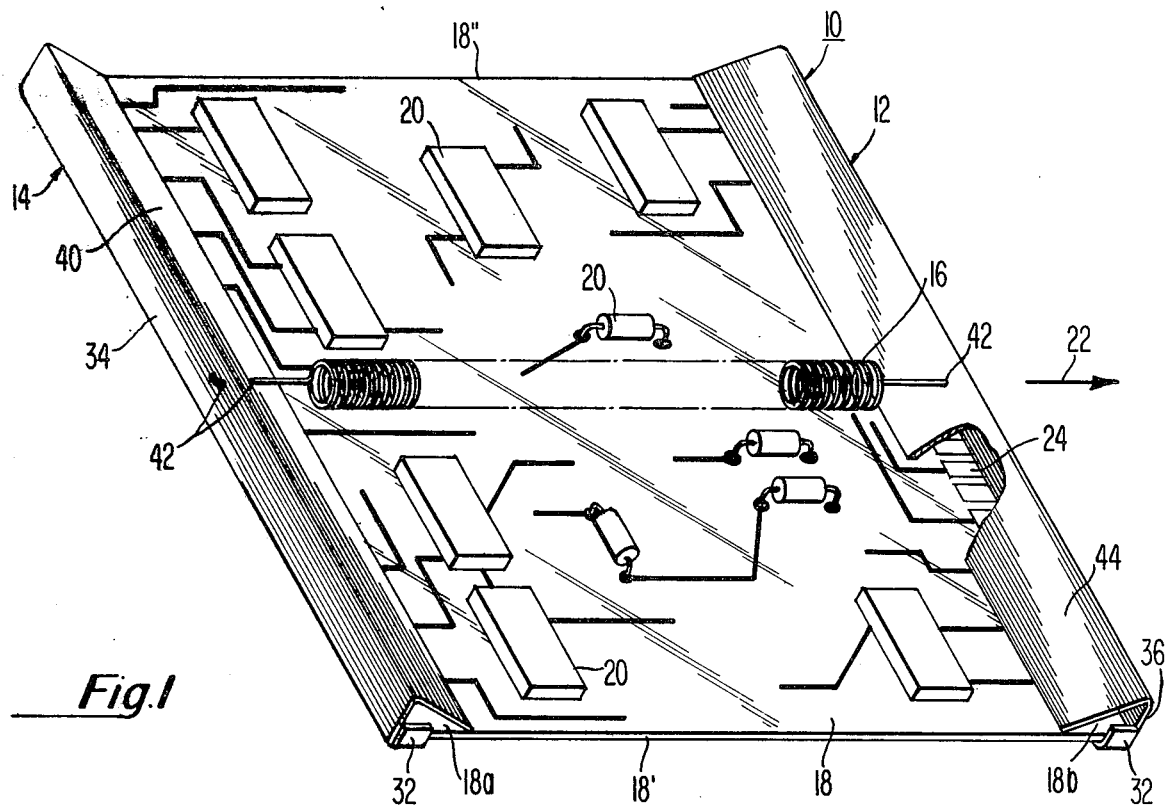
FIG. 1 is a pictorial view of the contact protector device of the present invention applied to a printed circuit board assembly.

As illustrated in FIG. 1, the device 10 of the present invention is comprised of a pair of sections 12 and 14 coupled to each other by a spring; 6 which tends to draw them toward each other. The device has been applied to a conventional printed circuit board assembly 18 on the upper surface of which are mounted a plurality of electrical components 20. In the usual solder wave operation, the board 18 is supported on both sides 10' and 18" by conveyor means (not shown) which carry the board through the solder wave, immersing its lower surface in the molten solder. Assuming that the direction of motion through the solder wave is depicted by arrow 22, section 12 of the device guards the leading edge surface at board end 18b, while section 14 protects the trailing edge at end 18a. The circuit board illustrated is of the double entry type in which the contact tabs 24 and 26 (See FIG. 2) to be protected from contact with solder lie along the respective upper and lower surfaces of both ends 18a and 18b of the board 18. The device may also be used with equal effectiveness for other contact arrangements, such as contacts on only one board surface, at one end of the board.

Figure 2:
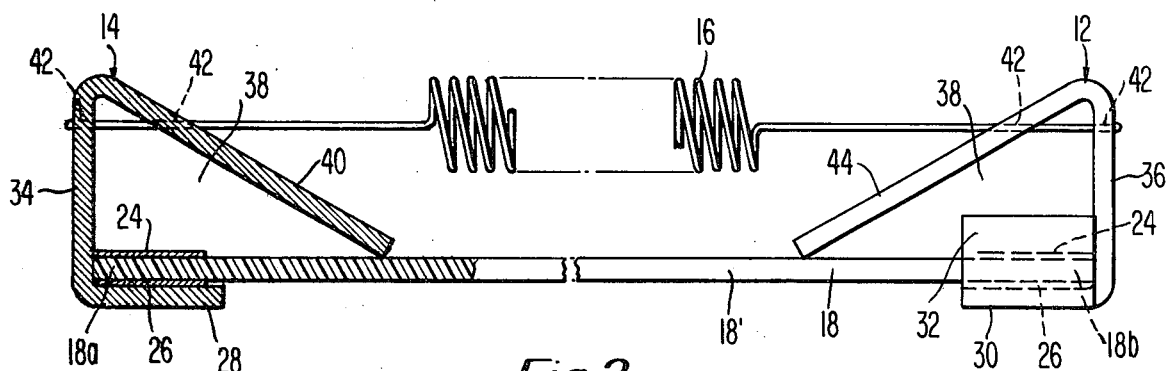
FIG. 2 is an end view of the device derived from FIG. 1, with the extremity of one of the device sections cut away to better illustrate its geometrical cross section and the relationship of the latter to the circuit board.

As will be described in greater detail in connection with FIG. 2, the lower board edge surfaces lie snugly against the respective inner surfaces of horizontal ledge members 28 and 30, by virtue of the forces exerted by spring 16. Accordingly, solder is prevented from contacting the lower contact tabs 26, (FIG. 2). The horizontal members 28 and 30 are designed for minimal extension below the board surface, which is necessary for solder wave operation. To further insure that no solder will enter the section and contaminate the upper contact tabs 24 (FIG. 2), the horizontal members 28 and 30 have been extended at each extremity of a section to form a tang 32 which has been bent upward in a vertical plane to partially enclose the end of the section.

The vertical section members 34 and 36 form respective dams which effectively prevent the solder from flowing onto the upper component surface of the board.

Finally, the sections 12 and 14 are preferably made of titanium, an alloy thereof, or other materials which effectively resist coating with solder, and are rigid. The application of sections 12 and 14 across the width of the respective ends of the board 18 serve to prevent the board from warping or sagging when it is exposed to the high temperatures of the soldering operation.

Figure 3:
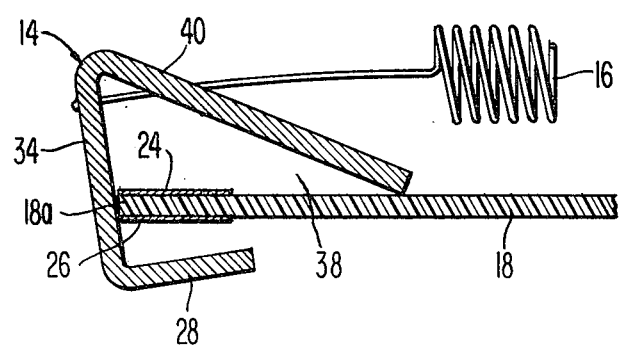
FIG. 3 is a view of the device sections detailed in FIG. 2 but shown in a pivoted position, permitting the insertion or removal of the board through the opening therein.

With reference to FIG. 2, it can be seen that each of the device sections 12 and 14 has a substantially right triangular cross-sectional geometry. An opening 38 in each section appears between a shortened horizontal member, for example 28 in section 14, and side 40 which is the hypotenuse of the triangular geometry. Friction-free insertion and removal of the printed circuit board 18 is accomplished as indicated in FIG. 3, by pivoting the section 14 about its horizontal axis through the vertex of the right angle. The edge of the board 18 with its gold contact tabs 24 and 26 is positioned substantially in parallel with the edge of the horizontal member and is inserted through the opening 38 until the extremity of board end 18a contacts side 34 of the section 14. Spring tension created by application of the remaining section 12 to the opposite board end 18b will return both sections 14 and 12 to their normal positions. The extremity of board 18 now lies substantially at the vertex of the right angle, and the lower contacts 26 rest upon the inner surface of the horizontal member 28. The length of the hypotenuse 40 is a function of the board thickness and is chosen such that the spring 16 will cause the free end thereof to exert a force upon the board sufficient to insure that the edge surface bearing the contacts will be held firmly against the inner surface of the horizontal member 28. This contiguous relationship and the normal vicosity of the solder prevent the latter from entering between the surfaces and damaging the contacts.

The tensioning means coupling the pair of sections may take different forms. In FIG. 2 a coiled spring 16 has been installed in the device by passing its initially straight ends through coaxial apertures 42 drilled through the respective upper portions of the hypotenuse 40 and vertical sides 34 of section 14 and hypotenuse 44 and side 36 of section 12, and then twisting the ends to prevent them from passing back through the apertures.

When the solder operation is completed, the board 18 is removed from the solder equipment conveyor. A first of the protective sections, for example 12, is again pivoted in opposition to the spring tension and the board and 18b is slipped out of the opening 38 without any friction between the contact tabs 24 and 26 and the sides of the section. The opposite end 18a of the board 18 is then easily removed in the same manner.

In conclusion, it is apparent that the contact protector device disclosed herein offers a simple, economical and effective solution to the problems involved in wave soldering printed circuit board assemblies. The inventive concepts and implementation described herein are directed to a specific application. In other applications, changes and modifications may be needed to suit particular requirements. Such variations as are within the skill of the designer, and which do not depart from the true scope and spirit of the invention are intended to be covered by the following claims.

I claim:

1. A device for protecting the edge contacts of a printed circuit board during wave soldering comprising:
   a pair of spaced-apart allochirally disposed sections;
   tensioning means coupling said sections to each other;
   each of said sections having a substantially right triangular cross-sectional geometry, the sides of the right angle portion of each of said sections defining respectively a vertical member and a horizontal member, the length of said horizontal member being abbreviated to provide an opening into said section between its extremity and that of a third side representing the hypotenuse of said triangular geometry;
   said sections being capable of being pivoted from their initial positions about horizontal axes through the respective vertices of their right angles thereby permitting the friction-free insertion of the respective opposite ends of said printed circuit boards through the openings therein;
   said tensioning means restoring said sections to their initial positions and causing the extremities of the third sides of said sections to exert respective forces on said circuit board which result in the lower surfaces at opposite ends of said board being held firmly in contiguity with the inner surfaces of said horizontal members.

2. A device as defined in claim 1 wherein said tensioning means is a coiled spring disposed at right angles to the longitudinal axes of said sections, said spring having a pair of extremities each of which passes through coaxial apertures located substantially at the midpoint of one of said longitudinal axes and in the respective upper portion of the hypotenuse and vertical side of one of said sections.

3. A device as defined in claim 2 further characterized in that each of said section horizontal members includes at its extremities respective tangs which partially enclose the ends of the section.

4. A device as defined in claim 3 further characterized in that the height of said section vertical member is of sufficient magnitude to prevent solder from flowing thereover onto the top surface of said circuit board.

5. A device as defined in claim 4 wherein said sections extend across the respective opposite full edge surfaces of the circuit board.

6. A device as defined in claim 5 further characterized in that each of said sections is formed in one piece.

7. A device as defined in claim 6 wherein said sections are comprised of rigid material which effectively resists coating with solder during the solder wave operation.

* * * * *